United States Patent [19]

Sato et al.

[11] Patent Number: 4,882,538
[45] Date of Patent: Nov. 21, 1989

[54] DEVICE FOR DETECTING CURRENT FLOWING IN AN ELECTRIC WIRE

[75] Inventors: Hiromitsu Sato; Shinichi Kubota; Atsushi Totsune; Masahiko Asakura, all of Wako, Japan

[73] Assignee: Honda Giken Kogyo Kabushiki Kaisha, Tokyo, Japan

[21] Appl. No.: 92,459

[22] Filed: Sep. 3, 1987

[30] Foreign Application Priority Data

Sep. 4, 1986 [JP] Japan ................ 61-208480

[51] Int. Cl.⁴ .................. G01R 11/34; G01R 19/00
[52] U.S. Cl. ..................... 324/127; 324/112 H; 324/225; 318/490
[58] Field of Search ........... 324/127, 158 MG, 117 H, 324/117 R, 242, 247, 244, 225, 227; 336/174, 175, 84 M; 318/490

[56] References Cited

U.S. PATENT DOCUMENTS

| 3,136,948 | 6/1964 | Windsor | 324/127 |
| 3,194,939 | 7/1965 | Hill | 324/117 H |
| 3,727,133 | 4/1973 | Marvin et al. | 318/490 |
| 4,123,009 | 10/1978 | Kilpinen | 318/490 |
| 4,315,204 | 2/1982 | Sievers et al. | 324/158 MG |
| 4,473,810 | 9/1984 | Souques et al. | 336/84 M |
| 4,506,218 | 3/1985 | Brown et al. | 324/117 H |
| 4,506,220 | 3/1985 | Sawada et al. | 324/225 |
| 4,611,154 | 9/1986 | Lambropoulos et al. | 318/490 |
| 4,675,607 | 6/1987 | Golker et al. | 324/247 |
| 4,710,712 | 12/1987 | Bradfield et al. | 324/227 |

FOREIGN PATENT DOCUMENTS

| 3130277 | 2/1983 | Fed. Rep. of Germany . |
| 0065166 | 5/1980 | Japan | 324/225 |
| 0580591 | 11/1977 | U.S.S.R. | 336/84 M |
| 1112418 | 9/1984 | U.S.S.R. | 336/84 M |

Primary Examiner—Reinhard J. Eisenzopf
Assistant Examiner—W. Burns
Attorney, Agent, or Firm—Lyon & Lyon

[57] ABSTRACT

A current detecting device for detecting current flowing in a first electric wire arranged close to a second electric wire having a portion extending in a predetermined direction. The device comprises: a portion of the first electric wire extending at right angles to the second electric wire; a magnetic core arranged around the above portion of the first electric wire, the magnetic core having an axis thereof extending at right angles to the above portion of the second electric wire; and a magnetic-to-electric transducer associated with the magnetic core for generating an electric signal indicative of the intensity of a magnetic field generated around the above portion of the first electric wire by current flowing in the first electric wire.

5 Claims, 3 Drawing Sheets

DEVICE FOR DETECTING CURRENT FLOWING IN AN ELECTRIC WIRE

BACKGROUND OF THE INVENTION

This invention relates to a device for detecting current flowing in an electric wire, and more particularly to a device of this kind which detects current flowing in an electric wire in an indirect manner by detecting the intensity of a magnetic field produced by the current.

Conventional current detecting devices include a type generally employed in ordinary type ammeters, which detects current in a direct manner by causing current to flow through a fixed resistance, and detecting a voltage drop between input and output terminals of the fixed resistance as representing the current. Another conventional type detects current in an indirect manner such that a magnetic core is arranged around an electric wire in which current flows, a magnetic field produced by the current is collected by the magnetic core, and the intensity of the magnetic field is detected in terms of voltage by means of a magnetic-to-electric transducer such as a Hall element and a magnetic reluctance element.

According to the former type, due to the direct detection of the current by means of the fixed resistance, there are disadvantages that electric power is consumed by the resistance, resulting in large power loss, the maximum current that can be detected is limited as the maximum allowable current that can flow through the fixed resistance is limited, the resistance value of the fixed resistance can vary due to heat generated in the fixed resistance by current flowing therein, resulting in an error in the detected current value. On the other hand, according to the latter type, although it is free of the above-mentioned disadvantages with the former type, if it is applied to detecting current flowing in one of a plurality of electric wires extending parallel with each other, it cannot accurately detect the current flowing in the one electric wire since the intensity of magnetic fields formed around the other electric wires is undesirably also detected by the magnetic-to-electric transducer provided in the magnetic core.

SUMMARY OF THE INVENTION

It is the object of the invention to provide a current detecting device of the type detecting current flowing in an electric wire from the intensity of a magnetic field produced around the electric wire, which is capable of accurately detecting current flowing in a selected one of a plurality of electric wires, without being affected by the intensity of magnetic fields produced around the other electric wires.

To achieve the above object, the present invention provides a current detecting device for detecting current flowing in a first electric wire arranged close to a second electric wire having a portion extending in a predetermined direction.

The current detecting device according to the invention is characterized by comprising: a portion of the first electric wire extending at right angles to the above portion of the second electric wire; a magnetic core arranged around the above portion of the first electric wire, the magnetic core having an axis thereof extending at right angles to the above portion of the second electric wire; and magnetic-to-electric transducer means associated with the magnetic core for generating an electric signal indicative of the intensity of a magnetic field generated around the above portion of the first electric wire by current flowing in the first electric wire.

The magnetic core has a slit formed therein, and the magnetic-to-electric transducer means comprises a magnetic-to-electric transducer element inserted into the slit.

In one embodiment of the invention, the second electric wire extends between a generator of an automotive vehicle and a battery of the automotive vehicle. The second electric wire includes a first fuse element disposed at an intermediate portion thereof. The first electric wire extends from a portion of the second electric wire located between the generator and the first fuse element, to an electrical load. The first electric wire includes a second fuse element disposed at an intermediate portion thereof. The above and other objects, features and advantages of the invention will be more apparent from the ensuing detailed description taken in conjunction with the accompanying drawings.

DETAILED DESCRIPTION

The invention will now be described in detail with reference to the drawings showing an embodiment thereof.

Figure 1:
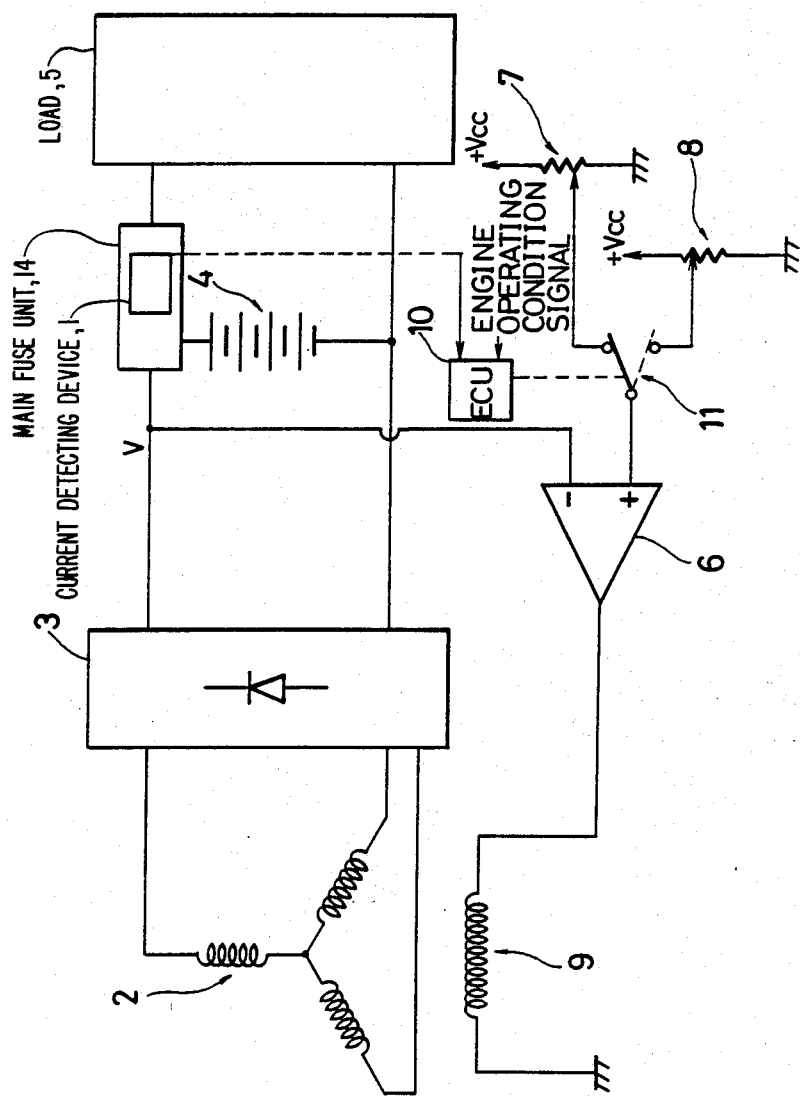
FIG. 1 is a circuit diagram of an electric power supply means for an automotive vehicle, including a generator, with which is associated a current detecting device according to the invention.

Referring first to FIG. 1, there is shown the circuit configuration of an electric power supply means for an automotive vehicle, including a generator, with which a current detecting device according to the invention is associated. The generator is a three-phase alternating current type. Alternating current is generated in three phases by a stator coil 2 of the generator and is delivered to a battery 4 of the automotive vehicle and an electrical load 5 by way of a rectifier 3 and a main fuse unit 14. A junction of the rectifier 3 and the main fuse unit 14 is connected to an inverting input terminal of a comparator 6, which is formed of an operational amplifier, so that an output voltage V from the battery 4 is inputted to the inverting input terminal of the comparator 6, through a main fuse 12 appearing in FIG. 2, hereinafter referred to. The comparator 6 has a non-inverting input terminal to which respective output terminals of variable resistors 7 and 8 are selectively connected through a selecting switch 11, and an output terminal connected to a field coil 9. The variable resistors 7 and 8 each have one end connected to a constant-voltage regulated power supply, not shown, and the other or opposite end grounded, and are manually adjustable so as to produce respective predetermined set output voltage through the intermediate output terminals. The comparator 6 compares the output voltage V from the battery 4 with a predetermined set value selectively supplied via the selecting switch 11 from the variable resistor 7 or 8, and energizes the field coil 9 to cause alternating current to be produced in the stator coil 2 for electric generation when the output voltage V falls below the predetermined set value.

A current detecting device 1 is provided within the main fuse unit 14 and adapted to detect a value of current supplied to an electrical load applied on the battery 4, such as headlamps, i.e. the magnitude of the electrical load and supply a signal indicative of the detected current value to an electronic control unit (hereinafter called "the ECU") 10, The ECU 10 is responsive to the detected current value supplied thereto to change the position of the selecting switch 11 by means of an actuator, not shown. To be specific, it connects the selecting switch 11 to the variable resistor 7 which supplies a lower predetermined voltage as the predetermined set voltage value, when the electrical load applied on the battery 4 is relatively small, and to the variable resistor 8 which supplies a higher predetermined voltage as the predetermined set voltage value when the electrical load is relatively large, respectively. The ECU 10 is supplied with signals indicative of operating conditions of the engine from various sensors, not shown. When the ECU 10 determines from the input signals that the engine is in a decelerating condition, it connects the selecting switch 11 to the variable resistor 8 to thereby cause the predetermined higher voltage to be applied to the comparator 6, irrespective of the current value detected by the current detecting device 1.

As stated above, when the electrical load applied on the battery 4 is relatively small, the predetermined lower voltage is applied to the comparator 6 at its non-inverting input terminal. Accordingly, a low level output is produced from the comparator 6 until the output voltage V from the battery 4, which is applied to the inverting input terminal of the comparator 6, drops below the predetermined lower voltage, whereby the generating amount of the generator is low. As a result, the discharge amount of the battery 4 is large whereas the substantial load on the engine, which drives the generator, is small. When the electrical load on the battery 4 is relatively large, the predetermined higher voltage is applied to the non-inverting input terminal of the comparator 6 so that the output voltage V from the battery 4 soon drops below the predetermined higher voltage and accordingly the generating amount of the generator becomes large.

When the engine shifts into a decelerating condition, the selecting switch 11 is switched over to the variable resistor 8. If on this occasion the output voltage V from the battery 4 is lower than the predetermined higher voltage, the generator provides a larger generating amount to charge the battery 4 at a higher rate. In this way, during deceleration of the engine the kinetic energy of the vehicle is converted into electric energy, and the electric energy is accumulated in the battery 4 whereby the fuel consumption can be reduced.

Figure 2:
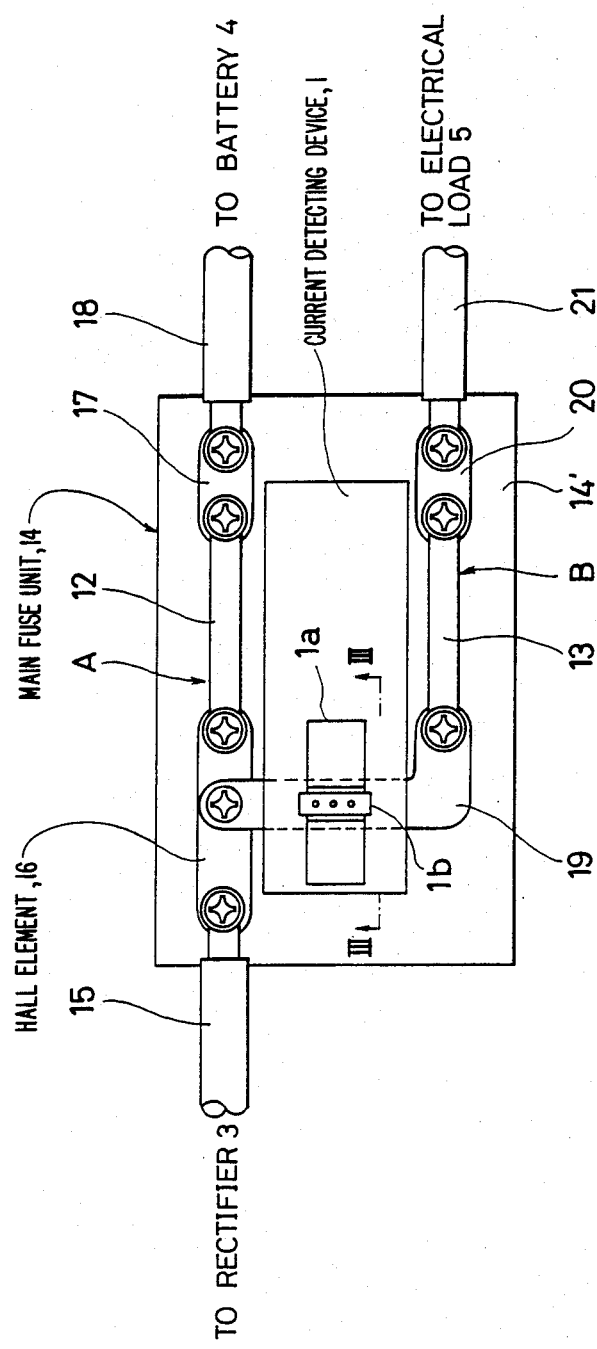
FIG. 2 is a front view showing the interior of a main fuse unit in which the current detecting device in FIG. 1 is provided.
Figure 3:
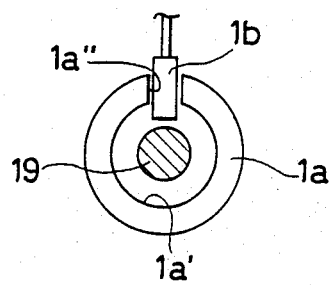
FIG. 3 is a cross-sectional view taken along line III-—III in FIG. 2.

FIG. 2 illustrates the internal arrangement of the main fuse unit 14 provided therein with the current detecting device 1 according to the invention.

The current detecting device 1 is mounted on a power board 14' of the main fuse unit 14 together with main fuse elements 12 and 13 for the purpose of reducing the mounting space for the parts 1, 14. A first electric wire A is formed by a connecting cord 15 extending from the rectifier 3 to the main fuse unit 14, a terminal element 16, the main fuse element 12, a terminal element 17, and a connecting cord 18 leading to the battery 4.. In the illustrated embodiment, at least the portion of the first electric wire A that is located on the power board 14' extends substantially straight. A second electric wire B is formed by a connecting wire 19 formed of a bare wire and extending from the terminal element 16 at right angles to the terminal element 16 or the electric wire A, the main fuse element 13, a terminal element 20 and a connecting cord 21 leading to the electrical load 5. Except for the connecting wire 19, the other parts 13, 20, and 21 of the second electric wire B extend parallel with the first electric wire A.

Arranged around the connecting wire 19 are a magnetic core $1a$ and a magnetic-to-electric transducer element $1b$ formed of a known Hall element, which form the current detecting device 1 together with the second electric wire B. The element $1b$ may be formed of a magnetic reluctance element, instead. The magnetic core $1a$ has a central through hole $1a'$ axially formed therein, through which the connecting wire 19 extends, and is disposed with its axis extending at right angles to the first electric wire A. The magnetic core $1a$, which is formed of a ferromagnetic material, is in the form of an annulus, but may be shaped otherwise. The magnetic core $1a$ has a peripheral wall portion thereof formed therein with an axial slit $1a''$ through which the Hall element $1b$ is inserted to detect the intensity of a magnetic field generated around the connecting wire 19 and collected by the magnetic core $1a$.

The operation of the current detecting device 1 according to the invention constructed as above will now be explained with reference to FIGS. 4 and 5.

Figure 4:
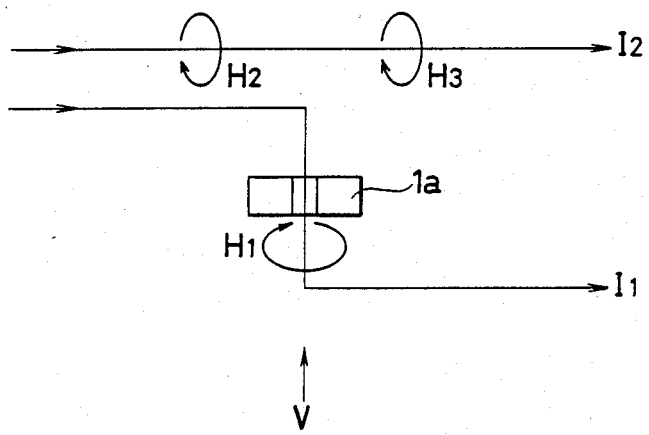
FIG. 4 is a view useful in explaining the operation of the current detecting device in FIG. 2.
Figure 5:
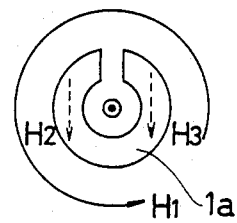
FIG. 5 is a view as viewed from the arrow in FIG. 4.

As shown in FIG. 4, according to the corkscrew rule, a magnetic field H1 is formed around the connecting wire 19, which turns along a plane perpendicular to the direction in which current I1 flows in the second electric wire B connected to the electrical load 5, and further magnetic fields H2 and H3 are formed around the first electric wire A and turn along a plane perpendicular to the direction in which current I2 flows in the first electric wire A. The magnetic fields H2 and H3 have the same intensity with each other and are located symmetrically with respect to the axis of the magnetic core $1a$. The magnetic field H3 located on the right side of the axis of the magnetic core $1a$ as viewed in FIG. 4 turns in the opposite direction to the magnetic field H1 so as to cancel the magnetic field H1. By contrast, the magnetic field H2 turns in the same direction as the magnetic field H1 so as to increase the intensity of the latter. Assuming that the turning direction of the magnetic field H1 is a plus direction, the total magnetic field intensity H can be expressed by the following equation (1):

$$H = H1 + H2 - H3 \tag{1}$$

Since the magnetic fields H2 and H3 are formed by the same current I2, they have the same intensity, that is, H2=H3. Therefore, the following equation (2) is derived from the equation (1):

$$H = H1 \tag{2}$$

Thus, the magnetic field intensity detected by the magnetic core $1a$ corresponds only to the intensity of the magnetic field H1 generated by the current I1 flowing in the second electric wire B.

As described above, the Hall element $1b$ can detect only the magnetic field generated by the current I1 flowing in the second electric wire B, i.e. only the current value that is to be detected, without being affected by the magnetic fields generated by the current I2 flowing in the first electric wire A, thus making it possible to accurately detect the current I1.

Although in the foregoing embodiment the electric wire B of which the flowing current is to be detected is disposed in a fashion branching off from the other electric wire(s) A, this is not limitative to the invention, but the invention may be applied to an arrangement that an electric wire whose flowing current is to be detected extends parallel with other electric wires or an arrangement that the current-detecting wire crosses with another electric wire.

What is claimed is:

1. A current detecting device for detecting current flowing in a first electric wire arranged close to a second electric wire having a portion extending in a predetermined direction, said second electric wire extending between a device of an automotive vehicle and a battery of said automotive vehicle, said first electric wire extending from a portion of said second electric wire located in a fuse unit to at least one electrical load, comprising:
    a portion of said first electric wire extending at right angles to said portion of said second electric wire;
    a magnetic core arranged around said portion of said first electric wire, said magnetic core having an axis thereof extending at right angles to said portion of said second electric wire; and
    magnetic-to-electric transducer means associated with said magnetic core for generating an electric signal indicative of the intensity of a magnetic field generated around said portion of said first electric wire by current flowing in said first electric wire.

2. A current detecting device as claimed in claim 1, wherein said magnetic core has a slit formed therein, and said magnetic-to-electric transducer means comprises a magnetic-to-electric transducer element inserted into said slit.

3. A current detecting device as claimed in claim 1, wherein said second electric wire includes a first fuse element disposed at an intermediate portion thereof, said first electric wire including a second fuse element disposed at an intermediate portion thereof.

4. A current detecting device for detecting current flowing in a first electric wire arranged close a second electric wire having a portion extending in a predetermined direction, said second electric wire extending between a generator of an automotive vehicle and a battery of said automotive vehicle, said second electric wire including a first fuse element disposed at an intermediate portion thereof, said first electric wire extending from a portion of said second electric wire located between said generator and said first fuse element, to an electrical load, said first electric wire including a second fuse element disposed at an intermediate portion thereof, comprising:
    a portion of said first electric wire extending at right angles to said portion of said second electric wire;
    a magnetic core arranged around said portion of said first electric wire, said magnetic core having an axis thereof extending at right angles to said portion of said second electric wire; and
    magnetic-to-electric transducer means associated with said magnetic core for generating an electric signal indicative of the intensity of a magnetic field generated around said portion of said first electric wire by current flowing in said first electric wire.

5. A current detecting device as claimed in claim 2, wherein said second electric wire includes a first fuse element disposed at an intermediate portion thereof, said first electric wire including a second fuse element disposed at an intermediate portion thereof.

* * * * *